(12) United States Patent
Parker et al.

(10) Patent No.: US 6,792,385 B2
(45) Date of Patent: Sep. 14, 2004

(54) METHODS AND APPARATUS FOR CHARACTERIZING BOARD TEST COVERAGE

(75) Inventors: Kenneth P. Parker, Fort Collins, CO (US); Kathleen J. Hird, Fort Collins, CO (US); Erik A. Ramos, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 18 days.

(21) Appl. No.: 10/233,768

(22) Filed: Sep. 1, 2002

(65) Prior Publication Data

US 2004/0044498 A1 Mar. 4, 2004

(51) Int. Cl.[7] .................................................. G06F 9/02
(52) U.S. Cl. ...................... 702/179; 702/117; 702/118; 702/182
(58) Field of Search .............................. 702/58, 59, 86, 702/90, 117, 179, 118–120, 173, 177, 182, 183, 189, 194, 199; 700/83; 709/223; 717/151; 703/27; 714/25, 37

(56) References Cited

U.S. PATENT DOCUMENTS

| | | | |
|---|---|---|---|
| 5,136,686 A | * | 8/1992 | Koza ............................ 395/13 |
| 5,271,090 A | * | 12/1993 | Boser .......................... 395/21 |
| 5,995,652 A | * | 11/1999 | Chiu et al. ................... 382/159 |
| 6,091,846 A | * | 7/2000 | Lin et al. ..................... 382/145 |
| 6,167,390 A | * | 12/2000 | Brady et al. .................. 706/20 |
| 6,400,996 B1 | * | 6/2002 | Hoffberg et al. .............. 700/83 |
| 2003/0018631 A1 | * | 1/2003 | Lipson et al. .................. 707/3 |

OTHER PUBLICATIONS

"ITC 1996 Lecture Series on Unpowered Opens Testing," K.P. Parker, Proceedings, International Test Conference, p. 924 (1996).

"Real–World Board Test Effectiveness: What Does It Mean When a Board Test Passes?", E.O. Schlotzhauer and R.J. Balzer, Proceedings, International Test Conference, pp. 792–797 (1987).

"Opens Board Test Coverage: When is 99% Really 40%?", M.V. Tegethoff, K. P. Parker, K. Lee, Proceedings, International Test Conference, pp.333–339 (Jun. 1996).

* cited by examiner

Primary Examiner—Marc S. Hoff
Assistant Examiner—Felix Suarez

(57) ABSTRACT

Disclosed are methods and apparatus for characterizing board test coverage. In one method, potentially defective properties are enumerated for a board, without regard for how the potentially defective properties might be tested. For each potentially defective property enumerated, a property score is generated. Each property score is indicative of whether a test suite tests for a potentially defective property. Property scores are then combined in accordance with a weighting structure to characterize board test coverage for the test suite.

30 Claims, 6 Drawing Sheets

PCOLA COMPONENT PROPERTY WEIGHTS (DPW)
FOR VARIOUS COMPONENT TYPES

| Component Type | dpw(P) | dpw(C) | dpw(O) | dpw(L) | dpw(A) |
|---|---|---|---|---|---|
| Resistor | 0.3 | 0.3 | 0 | 0.3 | 0.1 |
| Capacitor (non-polar) | 0.3 | 0.3 | 0 | 0.3 | 0.1 |
| Capacitor (polarized) | 0.225 | 0.225 | 0.225 | 0.225 | 0.1 |
| Diode | 0.225 | 0.225 | 0.225 | 0.225 | 0.1 |
| Digital IC | 0.225 | 0.225 | 0.225 | 0.225 | 0.1 |

FIG. 5

SOQ CONNECTION PROPERTY WEIGHTS (CPW)
BASED ON # OF POSSIBLE SHORTS

| # of Possible Shorts, s | cpw(S) | cpw(O) | cpw(Q) |
|---|---|---|---|
| s = 0 | 0 | 0.9 | 0.1 |
| s > 0 | 0.4 / s | 0.5 | 0.1 |

FIG. 6

MAXIMUM THEORETICAL COMPONENT PCOLA SCORES
VERSUS TEST TECHNOLOGY FOR A RESISTOR

| Test Type | P | C | O | L | A |
|---|---|---|---|---|---|
| In-Circuit | Full | Partial | (NA) | Full | Untested |
| AOI | Full | Full | (NA) | Untested | Full |
| AXI | Full | Untested | (NA) | Untested | Full |

FIG. 9

MAXIMUM THEORETICAL COMPONENT PCOLA SCORES
VERSUS TEST TECHNOLOGY FOR A DIGITAL DEVICE

| Test Type | P | C | O | L | A |
|---|---|---|---|---|---|
| In-Circuit | Full | Partial | Full | Full | Untested |
| AOI | Full | Full | Full | Untested | Full |
| AXI | Full | Untested | Full | Untested | Full |

FIG. 10

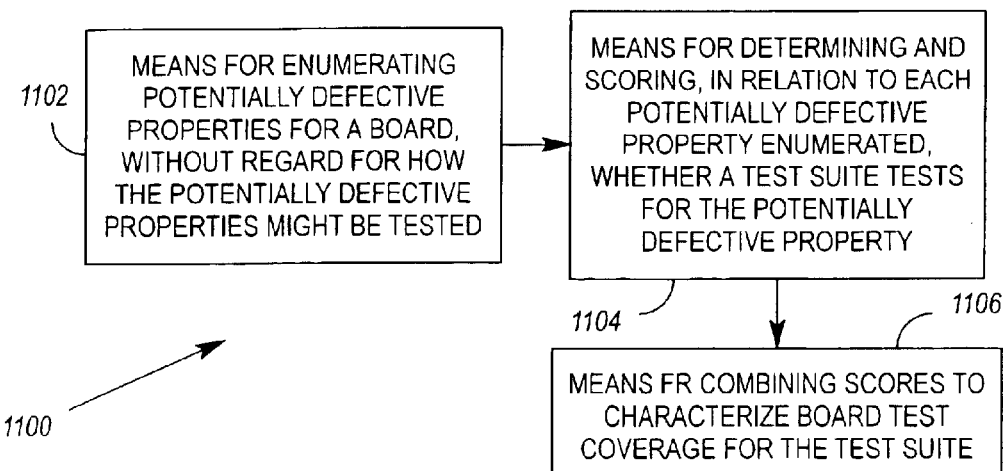

METHODS AND APPARATUS FOR CHARACTERIZING BOARD TEST COVERAGE

BACKGROUND OF THE INVENTION

In the past, the "board test coverage" provided by a particular test suite was often measured in terms of "device coverage" and "shorts coverage". Device coverage was measured as the percentage of board devices with working tests, and shorts coverage was measured as the percentage of accessible board nodes.

$$\text{Device Coverage} = \frac{\text{\# Tested Devices}}{\text{Total \# of Devices}}$$

$$\text{Shorts Coverage} = \frac{\text{\# Accessible Nodes}}{\text{Total \# of Nodes}}$$

The above model of board test coverage was developed at a time when testers had full nodal access to a board (i.e., access to the majority (typically 95–100%) of a board's nodes). Boards were also less dense, less complex, and somewhat more forgiving due to their lower frequency of operation. In this environment, the above model was acceptable.

Over the last decade, boards have migrated towards limited access. In fact, it is anticipated that boards with access to less than 20% of their nodes will soon be common. Some drivers of access limitation include:

Increasing board density (devices/square centimeter is increasing)

Fine line and space geometry in board layouts (i.e., smaller probe targets)

Grid array devices of increasing pitch density

High-frequency signals that demand precise layouts and offer no probe targets

Board node counts that are several times greater than the maximum available on any tester The above changes have made application of the "old" model of board test coverage difficult at best, and meaningless in many cases.

Usefulness of the "old" model of board test coverage has also been impacted by the advent of new and radically different approaches to testing (e.g., Automated Optical Inspection (AOI) and Automated X-ray Inspection (AXI)). Many of the new test approaches are very good at testing for certain defects, but limited in terms of the number of defects they can test. Thus, more and more often, it is becoming erroneous to presume that a device with working tests is a sufficiently tested device. As a result, a board is often submitted to different test processes, which in combination define the "test suite" for a particular board (see FIG. 2).

Given the above state of characterizing board test coverage, new methods and apparatus for characterizing board test coverage are needed.

SUMMARY OF THE INVENTION

According to one exemplary embodiment of the invention, a method for characterizing board test coverage commences with the enumeration of potentially defective properties for a board, without regard for how the potentially defective properties might be tested. For each potentially defective property enumerated, a property score is generated. Each property score is indicative of whether a test suite tests for a potentially defective property. Property scores are then combined in accordance with a weighting structure to characterize board test coverage for the test suite.

BRIEF DESCRIPTION OF THE DRAWINGS

Illustrative and presently preferred embodiments of the invention are illustrated in the drawings in which:

FIG. 5 illustrates how component property weights might be assigned for different device types;

FIG. 6 illustrates how connection property weights might be assigned based on the number of possible shorts that are associated with a connection;

FIG. 9 illustrates maximum theoretical component PCOLA scores versus test technology for an arbitrary resistor;

FIG. 10 illustrates maximum theoretical component PCOLA scores versus test technology for an arbitrary digital device; and FIGS. 11–13 illustrate various embodiments of apparatus for characterizing board test coverage.

DESCRIPTION OF THE PREFERRED EMBODIMENT

Definitions

Before describing methods and apparatus for characterizing board test coverage, some definitions will be provided.

"Board test coverage" (or simply "coverage") is an indication of the quality of a test suite.

A "defective property" is any property that deviates unacceptably from a norm. Defective properties include, but are not limited to:

An open solder joint.

A solder joint with insufficient, excess, or malformed solder (possibly with or without electrical manifestation).

A short caused by excess solder, bent pins, or device misregistration.

A dead device (e.g., an integrated circuit damaged by electrostatic discharge, or a cracked resistor).

A component that is incorrectly placed.

A missing component.

A polarized component that is rotated 180 degrees.

A misaligned component (typically laterally displaced).

A board can be tested for a potentially defective property by executing a "test". A test, as defined herein, is an experiment of arbitrary complexity that will pass if the tested properties of a component (or set of components) and their associated connections are all acceptable. A test may fail if any tested property is not acceptable. A simple test might measure the value of a single resistor. A complex test might test thousands of connections among many components. A "test suite" is a test or combination of tests, the collection of which is designed to sufficiently test a board so that the board is likely to perform its intended function(s) in the field.

Methods for Characterizing Board Test Coverage

In the past, test engineers have typically asked, "What does it mean when a test fails?" However, this question is often clouded by interactions with unanticipated defects, or even the robustness of a test itself. For example, when testing a simple digital device with an In-Circuit test, the test could fail for a number of reasons, including:

it is the wrong device;

there is an open solder joint on one or more pins;

the device is dead; or an upstream device is not properly disabled to a defect

With respect to characterizing board test coverage, it is more meaningful to ask, "What does it mean when a test passes?" For example, if a simple resistor measurement passes, it is known that the resistor is present, is functioning, is in the correct resistance range, and has connections that are not open or shorted together.

Figure 1:
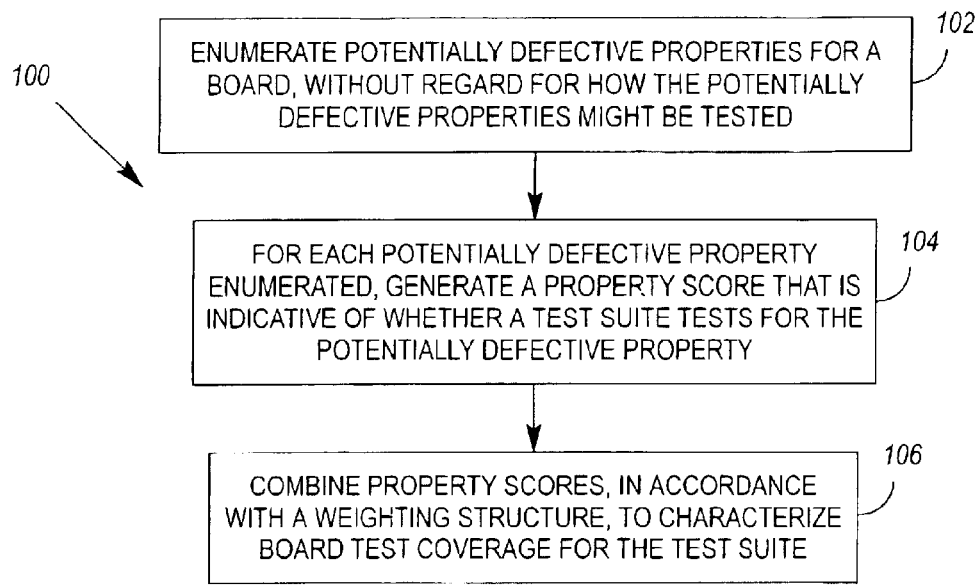
FIG. 1 illustrates a method for characterizing board test coverage.

FIG. 1 illustrates a method 100 for characterizing board test coverage. The method 100 commences with the enumeration 102 of potentially defective properties for a board, without regard for how the potentially defective properties might be tested. For each potentially defective property enumerated, a property score is generated 104. Each property score is indicative of whether a test suite tests for a potentially defective property. Property scores are then combined 106 in accordance with a weighting structure to characterize board test coverage for the test suite.

Potentially Defective Properties

A board's potentially defective properties can be enumerated by parsing descriptive information for the board, including, but not limited to: topology data (including XY position data), a netlist, a bill of materials, and/or computer aided design (CAD) data.

Figure 2:
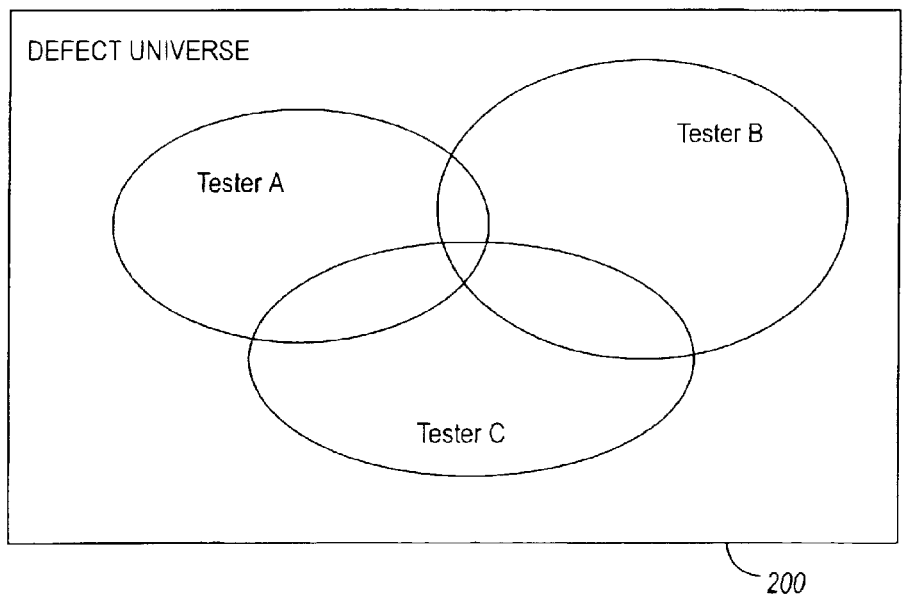
FIG. 2 illustrates a defect universe, and a VENN diagram of testers that cover the defect universe.

Together, the potentially defective properties for a board comprise a "defect universe". FIG. 2 illustrates such a defect universe 200, as well as a VENN diagram of various testers (Tester A, Tester B, and Tester C) that cover the defect universe 200. Although FIG. 2 illustrates a VENN diagram of testers, the potentially defective properties comprising a defect universe 200 can (and typically should) be enumerated without regard for how the potentially defective properties might be tested.

There are a number of potentially defective properties that may be enumerated for a board. In one embodiment of the FIG. 1 method, potentially defective properties are grouped into "component properties" and "connection properties". Properties in these two groups are believed to account for more than 90% of a board's potentially defective properties.

The properties for components and connections may be further subdivided into "fundamental properties" and "qualitative properties". Fundamental properties are properties that directly impact the operation of a board. Qualitative properties may not directly or immediately impact board operation, but have the potential to do so at some point in time (i.e., as a latent defect), or are indicative of manufacturing process problems that should be addressed before the problems degenerate to the point of impacting fundamental properties.

Component Properties

As defined herein, a "component" is anything placed on a board, such as a passive component (e.g, a resistor or inductor), an integrated circuit (IC), a connector, a heat sink, a mechanical extractor, a barcode label, a radio-frequency-interference (RFI) shield, a muiti-chip-module (MCM), a resistor pack, and so on. Basically, any item listed in a board's bill of materials is a component (although most components will take the form of an electrical device). Note, however, that the internal elements of an MCM or resistor pack are typically not counted as components. Although the above listed components are all tangible, components may also be intangible (e.g., a flash memory or Complex Programmable Logic Device (CPLD) download, or a functional test of a device cluster).

In one embodiment of the FIG. 1 method, the fundamental properties of a component comprise: presence, correctness, orientation and liveness. Of these, presence is the most critical, as the other three properties cannot be assessed if a component is missing.

Note that a test for component presence will sometimes imply that a component is the correct component. However, presence and correctness are preferably enumerated as two distinct properties so that incorrect presumptions as to component correctness are not made when characterizing board test coverage. For example, it can be determined from a resistor measurement test that a resistive component is present. However, the same test can only partially assess whether the correct resistor is present (e.g., because a resistor measurement test cannot determine whether a resistor is a carbon composition resistor, a wire-wound resistor, a 10 watt resistor or a 0.1 watt resistor).

Presence may be judged "partially tested" when there is not complete certainty that a component is there. For example, for a pull-up resistor connected between VCC and a digital input pin, a Boundary-Scan test can verify that the pin is held high. However, this state could also occur if the pin was open or floating.

A subset of the presence property is the "not present property". In the same way that it is desirable to determine whether the components of a board are tested for presence, it is desirable in some cases to make sure that a component is not present on a board (e.g., in the case where a given board is not to be loaded with an optional component).

A determination as to whether a test suite tests for component correctness can only be made after (or at the same time) it is determined that the test suite tests for component presence. Ways to test for component correctness include reading the identification (ID) number printed on a component using an Automated Optical-Inspection (AOI) system, or executing a Boundary-Scan test to read the ID code that has been programmed into an IC.

Correctness may be judged "partially tested" when there is not complete certainty that a component is correct. For example, consider the previously discussed resistor measurement test.

Another fundamental component property is orientation. Typically, orientation defects present as component rotation errors in increments of 90 degrees. There are a number of ways that a test suite might test for orientation defects. For example, an AOI system might look for a registration notch on an IC. An Automated X-ray Inspection (AXI) system might look for the orientation of polarized chip capacitors. An In-Circuit Test (ICT) system might verify the polarity of a diode.

The component property of liveness may encompass as many factors as is desired. In one embodiment of the FIG. 1 method, liveness means grossly functional, and does not mean that a component performs well enough to fulfill any specific purpose. For example, if a Boundary-Scan interconnect test passes, then the components that participated in the test must be reasonably alive (i.e., their test access ports (TAPs) are good, their TAP controllers work, their I/O pins work, etc.). An assumption of IC liveness could also be made if one NAND gate of a 7400 quad-NAND were to pass a test. Also, the successful measurement of a resistor's value is indicative of the gross functionality of a resistor (e.g., the resistor is not cracked, or internally shorted or open).

In a preferred embodiment of the FIG. 1 method, the only qualitative property of a component that is enumerated is component alignment. Alignment defects include lateral displacement by a relatively small distance, rotation by a few degrees, or "bill-boarding" (where a device is soldered in place but is laid on its side rather than flush with a board). Alignment differs from orientation in that an alignment defect may not result in an immediate malfunction, but may be indicative of a degenerative process problem or a future reliability problem.

The above component properties, together, are referred to at times herein as the PCOLA properties (i.e., presence, correctness, orientation, liveness and alignment). The FIG. 1 method preferably enumerates all of these potentially defective properties for a board, and possibly others. However, it is within the scope of this disclosure to enumerate less than all of these properties and/or different properties. Furthermore, different ones of the PCOLA property set could be enumerated for different components and/or component types on a board.

Intangible Component Properties

Although the concept of "intangible components" has already been introduced, intangible component properties deserve further discussion. Intangible components will usually be related to tangible components by the addition of one or more activities. In the context of a flash memory or CPLD download, the activity is an on-board programming process that installs bits into the relevant tangible component. Once identified, intangible components and their properties may be treated as part of a board's "component space" for purposes of characterizing board test coverage. Many of the component and connection properties outlined above will not apply to intangible components. For example, only presence and correctness (i.e., programming presence and programming correctness) would be applicable to a flash memory download.

Properties by Component Type

Although the PCOLA component properties are believed to account for 90% or more of a component's potentially defective properties, some of these properties may be meaningless with respect to particular component types. If a property need not be tested, then it need not be enumerated. As a result, one embodiment of the FIG. 1 method enumerates different potentially defective properties for different component types.

Properties by Package Type

Sometimes, component types may not be known, but it may be possible to identify package types. If this is the case, the FIG. 1 method may enumerate different potentially defective properties for different package types (since component types can often be inferred from package types).

Connection Properties

A "connection" is (typically) how a component is electrically connected to a board. As a result, connections are formed between component pins and board node pads. For purposes of this disclosure, the word "pin" is used as a general reference to any means for connecting a component to a board, including pins, leads, balls, columns, and other contacts. Both soldered and press-fit components comprise connections. A particular component may have zero or more connections to a board. For example, a resistor has only two connections, an IC may have hundreds of connections, and a heat sink may have none.

A special instance of a connection is the photonic connection (e.g., a connection between light emitting and light receiving devices, or a connection between a light emitting/receiving device and a photonic connector or cable). While not an electrical connection, a photonic connection is nonetheless used to transmit signals. Thus, on a board where an optoelectronic transmitter is connected to an optoelectronic receiver by means of a fiber optic cable, the transmitter, receiver and cable would all be components, with the cable having a connection at each of its ends.

An assumption factored into the following discussion is that bare boards are "known good" before valuable components are mounted on them. Thus, it is assumed that there are no node trace defects (e.g., shorts, opens, or qualitative items like improper characteristic impedance) intrinsic to a board at the time components are placed.

In one embodiment of the FIG. 1 method, the fundamental properties of a connection comprise: shorts, opens and quality.

Figure 3:
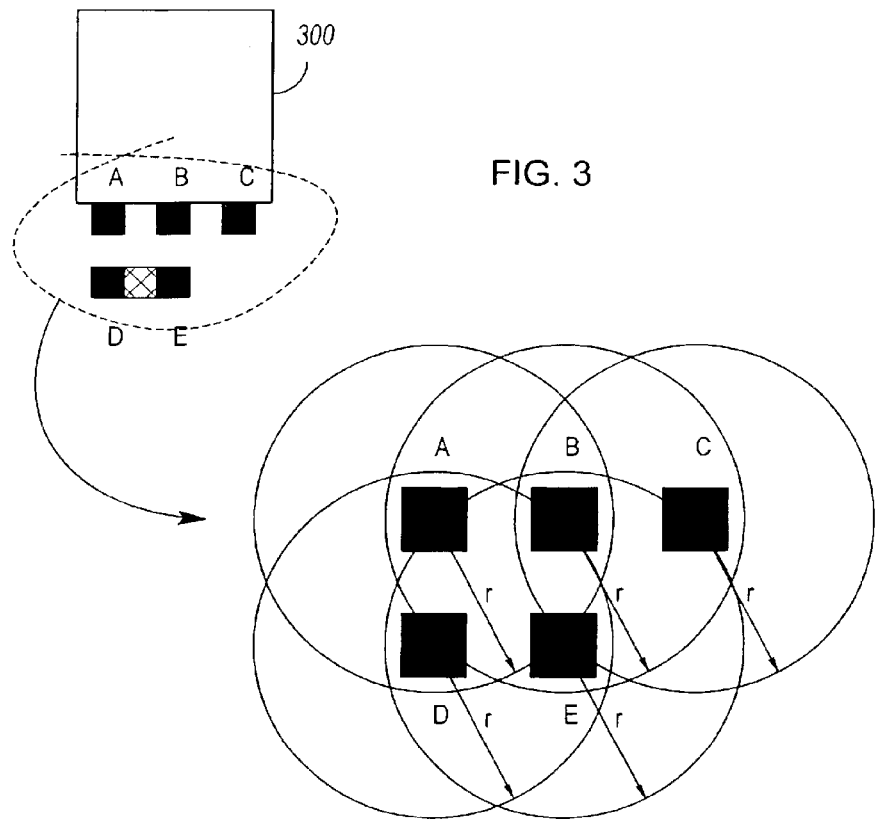
FIG. 3 illustrates the application of a proximity-based shorts model.

A short is an undesired connection. Shorts are typically caused by attachment defects such as bent pins and excess solder. As a result, shorts may be enumerated using a proximity-based model (see FIG. 3). If two pins (e.g., pins A, B, C, D, E) are within a specified "shorting radius, r", then there is an opportunity for them to be improperly connected, and a short between the two pins should be enumerated as a potentially defective property of a board. Proximity-based shorts enumeration may be undertaken using 1) the XY location of each pin, 2) the side of a board (top or bottom) on which a component is mounted, and 3) information as to whether a component 300 is surface or through-hole mounted.

Since a short is a reflexive property of two pins (i.e., if pin A is shorted to pin B, then pin B is shorted to pin A), a test suite's coverage of a short is best assessed by enumerating a short for only one of the two pins.

When enumerating shorts, it is possible that two pins within a shorting radius will be connected to the same node by a board's layout. As a result, it might seem that a potentially defective short property does not exist between these two pins. However, a bent pin or excess solder could still exist, and the pins might therefore be shorted in an inappropriate manner. As a result, a short property can still be enumerated for these pins. Only some testers can test for such a short property, and an identified defect may be benign. However, the defect might warn of a reliability issue or process problem.

In the past, electrical testers with full nodal access to a board would test each node for electrical independence from all other nodes (unless there existed a reason for why the nodes might be properly shorted). Although thorough, these testers tested for a lot of shorts that were highly improbable. Valuable test time was therefore wasted. Now that electrical access to a board's nodes has become limited, new technologies have arisen for detecting shorts. Many of these technologies focus on subsets of board nodes, and these subsets are typically (but not necessarily) disjoint. By enumerating potential shorts using a proximity-based model, the FIG. 1 method can better characterize the shorts coverage of these new technologies.

An open (sometimes referred to herein as a "joint open") is a lack of continuity in a connection. Typically, an open is complete—as is the case, for example, when there is an infinite direct current (DC) impedance between a pin and the board node pad to which it is supposed to be connected.

There is a class of "resistive" connections that are not truly open that may be electrically invisible during test. For purposes of this description, potential defects based on these resistive connections are enumerated as qualitative connection properties.

In a preferred embodiment of the FIG. 1 method, the only qualitative property of a connection that is enumerated is "joint quality" or simply "quality". Joint quality encompasses defects such as excess solder, insufficient solder, poor wetting, voids, and so on. Typically, these defects do not result in an immediate (or permanent) open or short. However, they indicate process problems and reliability problems that need to be addressed. For example, insufficient solder can result in an open joint later in a board's life. Excess solder on adjacent pins can increase the capacitance between the pins, to the detriment of their high-speed signaling characteristics. Improper wetting or voids may lead to increased resistance in connections. Certain qualitative defects such as a properly formed but cracked joint are very difficult to test. Yet, these defects should be considered in enumerating the potentially defective properties for a connection. If no tester is capable of testing for a potentially defective property, it is best that this is revealed when board test coverage is assessed.

With respect to opens and shorts, note that a photonic connection would typically be susceptible to opens, but shorts would only be possible between other photonic devices, as could occur if cables were swapped.

The above connection properties, together, are referred to at times herein as the SOQ properties (i.e., shorts, opens and quality). The FIG. 1 method preferably enumerates all of these potentially defective properties for a board, and possibly others. However, it is within the scope of this disclosure to enumerate less than all of these properties and/or different properties. Furthermore, different ones of the SOQ property set could be enumerated for different components and/or component types on a board.

Property Scoring

According to the FIG. 1 method, for each potentially defective property enumerated, a property score is generated. Each property score is indicative of whether a test suite tests for a potentially defective property.

In a simple scoring system, a potentially defective property is either tested for, or not. However, such a simple scoring will often fail to expose enough variance in the test coverage offered by different test suites. In one embodiment of the FIG. 1 method, a test suite's testing for a potentially defective property is scored as: Fully Tested, Partially Tested, or Untested. So that it is easier to combine these scores, they may be converted to numerical equivalents, such as:

| | |
|---|---|
| Untested = | 0 |
| Patially Tested = | 0.5 |
| Fully Tested = | 1.0 |

Figure 4:
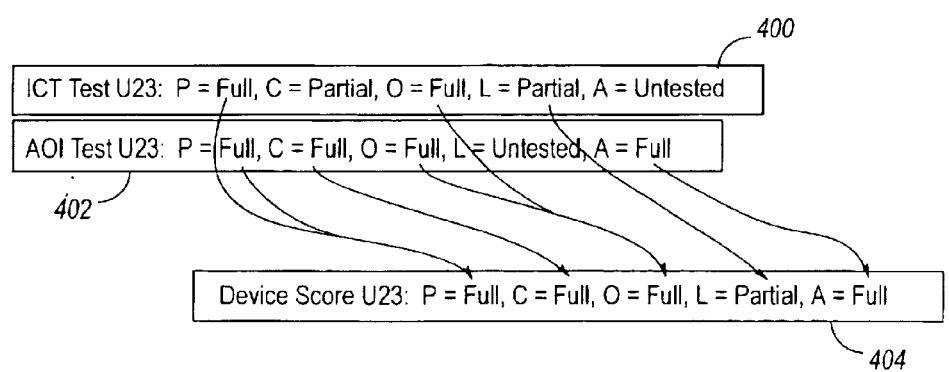
FIG. 4 illustrates an exemplary combination of component property scores.

As will be explained in greater detail later in this description, two or more property scores can be generated for the same potentially defective property if the property is tested by two or more tests in a test suite. In such instances, it should not be assumed that two Partially Tested scores add to yield a Fully Tested score. Such an addition can only be undertaken by analyzing the scope of what is tested by each of the two tests. By default, it is therefore safer to combine two property scores using a MAX( ) function. Thus, for example, two Partially Tested scores 400, 402 (FIG. 4) combine to yield a Partially Tested score 404. FIG. 4 illustrates the combination of PCOLA scores corresponding to ICT and AOI testing of the same component.

Component Scoring

If the PCOLA properties are the ones that have been enumerated, then the property scores (dps) for a given component (d) may be combined to generate a "raw component score" (RDS) as follows:

$$RDS(d)=dps(P)+dps(C)+dps(O)+dps(L)+dps(A)$$

Individual component scores may be combined to generate a board component score (i.e., an indication of a test suite's component coverage in general).

Board component scores for different test suites and the same board may be compared to determine the relative test coverage that each suite provides for the board. These comparisons may then be used in selecting a test suite that provides adequate test coverage for a board. Note, however, that the test suite offering the "best" coverage may not be chosen due to factors such as: time needed for execution, cost of execution, ease of implementation, etc. Board component scores may also be compared for the purpose of adjusting the makeup of a test suite. For example, if a certain defect is being noted "in the field", additional tests for this defect might be desired.

Board component scores may also be compared for a given test system. In this manner, it is possible to evaluate the robustness of a test system in its ability to test different types of boards for the same types of enumerated defects.

Connection Scoring

If the SOQ properties are the ones that have been enumerated, then the property scores (cps) for a given connection (c) may be combined to generate a "raw connection score" (RCS) as follows:

$$RCS(c)=cps(S)+cps(O)+cps(Q)$$

Individual connection scores may be combined to generate a board connection score (i.e., an indication of a test suite's connection coverage in general).

Similarly to how board connection scores may be compared for different test suites and/or boards, board connection scores may also be compared.

Generation of Property Scores

Property scores are derived from the tests of a test suite. For each test, it is determined 1) what components and connections are referenced by the test, and 2) how well the potentially defective properties of the components and connections are tested by the test. Following are some exemplary formulas for deriving scores from tests.

Unpowered Analog Electrical Tests

The following definitions may be used by an unpowered analog test system:

Test_statement: For analog in-circuit, this is the source-level measurement statement that performs the measurement (i.e., "resistor"). If the test generator cannot write a reasonable test, then it comments the measurement statement in an analog in-circuit test.

Device_limit: The tolerances of the device as entered in board topology.

Test_limit: The high and low limits of the test as specified in the test source. Although high and low limits need to be considered separately, for simplicity, they are treated collectively in the following rules.

For analog in-circuit tests of resistors, capacitors, fuses, jumpers, inductors, field-effect transistors (FETs), diodes, and zener diodes, score:

| | |
|---|---|
| Presence (P): | if (test_statement not commented) then P = Full |
| Correctness (C): | if (L > Untested) then C = Partial |
| Liveness (L): | if (test_limit < 1.8 * device_limit) then L = Full, else if (test_statement not commented) then L = Partial |
| Orientation (O): | if ((test_type is DIODE or ZENER or FET) and (L > Untested)) then O = Full |
| Shorts (S): | if (P > Untested) then Mark_Shorts_Coverage(Node_A, Node_B) |
| Opens (JO): | if (P > Untested) then device's pins score JO = Full |

The Mark_Shorts_Coverage routine marks any adjacent pins (Node_A, Node_B) as Fully Tested. This includes pin pairs on devices other than the target device(s).

For transistors (two diode tests and one BETA test), score:

| | |
|---|---|
| Presence (P): | if ((BE_diode_statement not commented) and (BC_diode_statement not commented) then P = Full, else if ((BE_diode statement not commented) or (BC_diode_statement not commented) then P = Partial |
| Correctness (C): | if (L > Untested) then C = Partial |
| Liveness (L): | if ((BETA_test_statement not commented) and (BETA_test_limit < 1.8 * BETA_device_limit)) then L = Full, else if (BETA_test_statement not commented) then L = Partial |
| Orienation (O): | if (L > Untested) then O = Full, else if (P > Untested) then O = Full |

Shorts and opens coverage on base, emitter and collector joints are included in the above tests for diodes.

In the above scoring, note that BE (base/emitter) and BC (base/collector) tests are PN junction tests that check for the presence of the device. A diode test is used to test the junction. Also note that BETA_test_statement measures the current gain of the transistor for two different values of base current.

For part libraries, including but not limited to resistor packs, each child's scores may be used to assess its parent. Thus,

| | |
|---|---|
| Presence (P): | P = <the best presence score of any child> |
| Correctness (C): | if (L > Untested) then C = Partial |
| Liveness (L): | if (children_live_tested_fully equals total_number_of_children) then L = Full, else if (children_live_tested_fully >= 1) then L = Partial |
| Orientation (O): | if (L = Full) then O = Full |

Shorts and opens coverage on pins of child devices are included in their subtests.

Note that children_live_tested_fully equals the number of child devices scoring L=Full. Also, total_number_of_children equals the total number of child devices and does not include "no test" child devices. "No test" devices have an "NT" option entered in board topology.

For switches (threshold test—might have subtests) and potentiometer (resistor test with two subtests), the following rules may be applied after all subtests have been scored according to previously provided rules:

| | |
|---|---|
| Presence (P): | P = <the best presence score of the children> |
| Correctness (C): | if (L > Untested) then C = Partial |
| Liveness (L): | if (subtest_tested_fully equals total_number_of_subtests) then L = Full, else if (subtest_tested_fully >= 1) then L = Partial |
| Orientation (O): | O = L |

Shorts and opens coverage on pins of tested devices are included in their subtests.

For capacitors in a parallel network, where the equivalent capacitance is the sum of the device values, each capacitor is evaluated as follows:

| | |
|---|---|
| Presence (P): | if ((test_high_limit − device_high_limit) < (test_low_limit)) then P = Full |
| Shorts (S): | if (P > Untested) then Mark_Shorts_Coverage(Node_A, Node_B) |
| Opens (JO): | if (P > Untested) then both connections score JO = Full |

In the above formulas, test_high_limit is the higher limit of the accumulated tolerances of the capacitors, along with the expected measurement errors of the test system itself (and test_low_limit is the opposite). Device_high_limit is the positive tolerance of the device being tested, added to its nominal value. Node_A and Node_B are those nodes on the capacitor pins.

Only those capacitors determined to be tested for Presence are eligible for Joint Shorts and Joint Opens coverage. Parallel capacitors are not eligible for the remaining properties of Correctness, Liveness and Orientation.

The implications of this rule for bypass capacitors is that only large, low-frequency bypass capacitors will receive a grade for Presence. Small, high-frequency capacitors will score Untested for Presence. For example:

1. Consider C1 = 500 nF in parallel with C2 = 100 nF, both with 10% tolerance.
   For C1, 660 − 550 = 110 < 540, so P = Full.
   For C2, 660 − 110 = 550 > 540, so P = Untested.
2. Consider six 100 nF capacitors in parallel, all with 10% tolerance.
   For Cx, 660 − 110 = 550 > 540, so P = Untested for each capacitor.

TestJet® Test

TestJet® tests measure, for each pin on a device, the capacitance between the pin and a sensor plate placed over the device package. Some of the pins of the device can be omitted from testing. TestJet® tests are scored for each tested device as:

| | |
|---|---|
| Presence (P): | if (at_least_one_pin_tested) then P = Full |
| Opens (JO): | all tested pins score JO = Full |

In some cases, due to limited access, a TestJet® measurement is made through a series resistor connected directly to the device under test. Consequently, properties of the series resistor are implicitly tested. The TestJet® pin measurement can only pass if the series resistor is present and connected. Thus, the Presence of the series resistor inherits the Joint Open score of the tested pin (i.e., P for resistor=JO score of the tested pin). Likewise, the Joint Open property for each pin of the resistor is implicitly tested by a test of the pin. The Joint Open score for the series component also inherits the JO score of the tested device joint (i.e., JO=JO score of tested pin). Thus, in a limited access environment, properties of devices not traditionally thought of as test targets may be tested as well. It therefore pays to ask, "What does it mean if a test passes?"

Polarity Check

A Polarity Check test usually contains subtests for multiple capacitors and may be scored as follows:

| | |
|---|---|
| Presence (P): | if (device_test_statement not commented) then P = Full |
| Orientation (O): | if (device_test_statement not commented) then O = Full |

Connect Check Tests

A Connect Check test usually contains subsets for multiple devices and may be scored as follows:

| | |
|---|---|
| Presence (P): | if (device_test_statement not commented) then P = Full |
| Opens (JO): | if (P > Untested) then tested pins score JO = Full |

Magic Tests

A Magic test is one test that contains multiple device tests. The scoring below will depend on the fault coverage numbers calculated for each device by the compiler. A value of "2" for a particular fault means the fault is both detectable and diagnosable. A value of "1" for a particular fault means the fault is only detectable.

| | |
|---|---|
| Presence (P): | if (OpensDetected >= 1) then P = Full |
| Correctness (C): | if (L > Untested) then C = Partial |
| Liveness (L): | if ((VeryHigh >= 1) and (VeryLow >= 1)) then L = Partial |
| Orientation (O): | if ((test_type is FET) and (L > Untested)) then O = Partial |

Digital In-Circuit Tests

Digital In-Circuit tests (excluding Boundary-Scan) are extracted from prepared libraries of test vectors, and are often modified in light of board topology. For a Digital In-Circuit test, device and connection properties may be scored as follows:

| | |
|---|---|
| Presence (P): | if (pin_outputs_toggled > O) then P = Full |
| Correctness (C): | if (pin_outputs_toggled > O) then C = Partial |
| Orientation (O): | if (pin_outputs_toggled > O) then O = Full |
| Liveness (L): | if (pin_outputs_toggled > O) then L = Full |
| Joint Open (JO): | if (pin_is_output) and (pin_toggled) then JO = Full, else if ((pin_outputs_toggled > O) and (pin_is_input) and (pin_toggled)) then JO = Partial |

In the above formulas, pin_outputs_toggled is the number of output (or bidirectional) pins that are tested for receiving high and low signals.

Input pin opens are preferably never scored better than Partial since 1) fault simulated patterns are extremely rare, and 2) some test vectors may have been discarded due to topological conflicts (e.g., tied pins).

Boundary-Scan Tests

Boundary-Scan In-Circuit tests may be scored as simple digital In-Circuit tests (see supra).

All Boundary-Scan tests include TAP (test access port) integrity tests that ensure that the Boundary-Scan control connections and chain wiring are working. Thus, each test covered in subsequent sections will cover all defects related to this test infrastructure. For each device in a Boundary-Scan chain, the following scores are given:

| | |
|---|---|
| Presence (P): | P = Full |
| Correctness (C): | if (Device has an ID Code) then C = Full, else C = Partial |
| Orientation (O): | O = Full |
| Liveness (L): | L = Full |
| Opens (JO): | For TCK, TMS, TDI, TDO pins, JO = Full; For TRST* and compliance enable pins, JO = Partial |
| Implicit Coverage: | Check all TAP and compliance enable pins for implicit coverage of series components (see "Implicit Device Coverage" later in this Description). |

For Connect Tests, score:

| | |
|---|---|
| Opens (JO): | For each tested pin, JO = Full; For each fixed high/low or hold high/low pin, JO = Partial |
| Implicit Coverage: | Check all tested pins for implicit coverage of series components. |

For Interconnect Tests, score:

| | |
|---|---|
| Opens (JO): | For each tested pin, JO = Full; For each fixed high/low or hold high/low pin, JO = Partial |
| Shorts (S): | For all nodes tested, Mark_Shorts_Coverage(). Powered nodes should be added to this list because shorts between Boundary-Scan nodes and powered nodes are detected as well. |
| Implicit Coverage: | Check all tested pins for implicit coverage of series components. |

For Buswire Tests, score:

| | |
|---|---|
| Joint Opens (JO): | For each tested pin, JO = Full; For each fixed high/low or hold high/low pin, JO = Partial |
| Implicit Coverage: | Check all tested pins for implicit coverage of series components. |

For Powered Shorts Tests, score:

| | |
|---|---|
| Shorts (S): | For each unnailed node A associated with silicon node B, Mark_Shorts_Coverage (A, B) |
| Implicit Coverage: | Check all tested pins for implicit coverage of series components. |

A silicon nail test tests a target non-Boundary-Scan device. For these tests, devices may be scored identically to digital In-Circuit devices. Thus,

| | |
|---|---|
| Opens (JO): | For each Boundary-Scan pin used to test a target device pin, JO = <inherit JO value of target device pin> |
| Implicit Coverage: | Check all tested pins for implicit coverage of series components. |

Analog Functional Tests

Tests that apply to a device will receive PCOL and JO scores. Tests that apply to circuit function may be considered "intangible" and scored as such.

| | |
|---|---|
| Presence (P): | if (device_test_statement not commented) then P = Full |

In the above case, the device_test_statement can take a variety of forms. For example, many analog powered tests contain calls to measurement subtests. Other tests do not contain subtests, and take only a single measurement. Various criteria will therefore be required to determine whether a test source is commented. For example, for tests having subtests, a compiler can look for uncommented "test" statements, and for tests not having subtests, the compiler can look for uncommented "measure" or "report analog" statements. The remaining PCOL and JO properties may be scored as follows:

| | |
|---|---|
| Correctness (C): | if (L > Untested) the C = Partial |
| Liveness (L): | if (P > Untested) then L = Partial |
| Orientation (O): | if (P > Untested) then O = Full |
| Opens (JO): | if (P > Untested) then JO = Full for tested pins |

Note that the above Correctness and Liveness scoring assumes that tests perform meaningful measurement(s) of a device's functions.

With respected to Joint Opens, tested pins are defined to be connected to a source or detector. As a result, connections found within a subtest should only be considered for coverage if the subtest is actually being called and is not commented.

Coupon Tests

A coupon test is assumed to be well formed. That is, the manufacturing process is assumed to follow rules about the sequencing of devices during placement. For coupon tests, the "representative" is defined as the device actually being tested. The representative represents "constituents", which are devices not being tested. The representative is scored according to its type, and the representative's constituents are scored as follows:

| | |
|---|---|
| Correctness (C): | <constituents inherit the C grade of their representative> |

Implicit Device Coverage

Some devices, due to limited access, are not directly tested by a tester, but may have properties implicitly tested (e.g., when a seemingly unrelated test passes, and it is can be deduced that the test cannot pass unless a non-target component is present and connected.

If a test resource is connected to a tested device through a series component such as a series termination resistor, then the presence of that resistor is implicitly tested by testing the tested device. Thus,

| | |
|---|---|
| Presence (P): | P = <presence score of tested device> |

If a test resource is connected to a tested device through a series component such as a series termination resistor, then the open properties of the resistor's pins are tested by testing the tested device. The open properties of the series component inherit the opens score of the tested device. Thus,

| | |
|---|---|
| Opens (JO): | JO = <open score of tested device pin> |

Automated X-Ray Inspection (AXI) Tests

AXI systems look at dense objects on a board, such as lead solder joints and the tantalum slugs within certain capacitors, some of which may be polarized. AXI systems can also rate joints for quality. An AXI system can also correlate a group of problems (e.g., opens) with a missing device or an alignment problem.

| | |
|---|---|
| Opens (JO): | for each viewed joint, score JO = Full |
| Presence (P): | if all pins of a device are viewed and correlated, then score P = Full for the device |
| Shorts (S): | for each viewed joint pair, score S = Full |
| Alignment (A): | if all pins of a device are viewed and correlated, then score A = Partial for the device |
| Joint Quality (Q): | for each viewed joint, if either insufficient/void or excess tested, then score Q = Partial, else if both insufficient/void and excess tested, then score Q = Full |

For tantalum capacitors, score P=Full if the capacitor is viewed, and score Orientation (O)=Full if the capacitor's polarization is viewed.

Weighting Structures

It is sometimes desirable to combine property scores in accordance with a weighting structure. In this manner, more or less importance can be placed on the value of test coverage for different properties.

Component Property Weights

If the PCOLA properties are the ones that have been enumerated, then the property scores (dps) for a given component (d) may be combined in accordance with component property weights (dpw) to generate a "raw component score" (RDS) as follows:

$$RDS(d)=dps(P)*dpw(P)+dps(C)*dpw(C)+dps(O)*dpw(O)+dps(L)*dpw(L)+dps(A)*dpw(A)$$

In one embodiment of the above formula, the component property weights are five fractions that sum to 1.0. The fractions may vary for different component types (or for different individual components—e.g., when the components within a type have a great deal of variance). For example, the Orientation weight for a resistor can be assigned a component property weight of 0.0 since a resistor is non-polarized. More weight can then be given to a resistor's other property weights. The opposite is true for a diode, where Orientation may be given more importance.

An example of how weights might be assigned for different component types is illustrated in FIG. 5. Note that for each component type, the qualitative property Alignment is given a property weight of 10%. Since an In-Circuit test system cannot test for alignment, an In-Circuit test system (taken alone) could at best provide 90% test coverage for a board, and a visual test system such as AOI would be needed to round out a board's test coverage. Although an AOI test system can also test for Presence, Correctness and Orientation, it cannot test for Liveness. As a result, an AOI test system (taken alone) cannot provide 100% test coverage for a board.

Note that the FIG. 5 property weights attribute 90% of a component's weight to its fundamental properties. This 90% weight may be equally distributed across a component's relevant properties. Thus, for polarized capacitors, diodes and digital ICs, equal weight is given to Presence, Correctness, Orientation and Liveness. However, for non-polarized, symmetric components like SMT resistors, the Orientation property is given no weight at all.

Component Type Weights

Component types may also be weighted, thereby allowing a component type to be given more or less importance when assessing board test coverage. Consider, for example, a board with 1000 surface-mount resistors that have a failure rate of 100 PPM (parts per million) and 100 digital components that have an average pin count of 500 and a failure rate of 5000 PPM. A manufacturer is likely to worry about bad ICs more than bad resistors, even though there are ten times as many resistors on the board. Weighting the ICs more heavily will cause a test that marginally tests the ICs to look worse than a test that tests ICs thoroughly. Conversely, not weighing the ICs more heavily will cause a test suite that thoroughly tests the resistors to look better than it really is.

One way to assign component type weights is to normalize a board's component type failure Pareto diagram onto a unit weight of 1.0. Another approach would be to use a uniform distribution (e.g., when no failure history is available).

If component type weighting is used, then a component type weight $dw(t)$, where t is a component type, may be factored into a component's raw score as follows:

$$RDS(d)=dw(t)*[dps(P)*dpw(P)+dps(C)*dpw(C)+dps(O)*dpw(O)+dps(L)*dpw(L)+dps(A)*dpw(A)]$$

Package Type Weights

If package types are known, package types may be weighted similarly to how component types are weighted.

Population Adjusted Weights

Under the scoring and weighting systems disclosed so far, it is difficult to compare board test coverage scores for different boards. For example, a board with a handful of components and connections might receive a board component score of 100, whereas a board with thousands of components and connections might receive a score of 20,000. At first glance, one might assume that the latter board has better test coverage. Yet, if the maximum achievable score for the first board is 110, and the maximum achievable score for the second board is 30,000, it becomes clearer that test coverage for the second board is not as good.

To make it easier to compare board test coverage scores, two concepts are introduced. The first is that of a "Range". As defined herein, a Range defines the lowest and highest test coverage scores that any board may receive. Preferably, the high end of a Range is selected such that a high degree of granularity in scoring is possible without frequent resort to the use of fractions. For example, the Range for a board component score might be 0 to 100,000, and the Range for a board connection score might also be 0 to 100,000. A board with perfect board test coverage would therefore receive the scores: BDS=100,000, BCS=100,000. However, given that many boards will not have a high enough component and connection count to be eligible for a perfect score, the concept of "population adjusted weighting" is also introduced.

With population adjusted weighting, component weights are adjusted in response to the population of components actually on a board. Consider a board with 1000 resistors, 100 digital ICs, 200 capacitors and no other component types. The weights normally assigned to other component types can never contribute to the board's test coverage scores, a perfect score for the board would always be well under component and connection ranges of 100,000. To redistribute component weights with respect to population, the following procedure may be followed:

1. Let N be the total number of components on the board.
2. Let $n(t)$ be the population of component type t (ranging from 1 to N).
3. Let $dw(t)$ be the component type weight of component type t (where for all t, Sum $[dw(t)]=1.0$).
4. For all t, Sum $[(n(t)*dw(t)]$ and call this the "component weight adjuster", A. This component weight adjuster is indicative of the population of component types on a given board.
5. For a given component d, calculate a component score, DS(d) as:

$$DS(d)=RDS(d)*Range*dw(t)/A$$

By following the above procedure, a board's maximum possible "board component score" will always be equal to the Range. The actual board component score (BDS), however, may be calculated as follows:

$$BDS=\text{for all components } d, \text{Sum } [DS(d)]$$

Connection Property Weights

If the SOQ properties are the ones that have been enumerated, then the property scores (cps) for a given connection (c) may be combined in accordance with connection property weights (cpw) to generate a "raw connection score" (RDS) as follows:

$$RCS(c)=cps(S)*cpw(S)+cps(O)*cpw(O)+cps(Q)*cpw(Q)$$

In one embodiment of the above formula, the connection property weights are three fractions that sum to 1.0. The fractions may vary for different connection types (e.g., electronic versus photonic), but need not.

Connection property weights may be chosen to reflect a property's importance. For example, in today's SMT technology, opens are often more prevalent than shorts, so opens can be weighed more heavily.

Note that zero or more shorts may exist for a given connection. Property weights therefore need to be adjusted with respect to the population of possible shorts for a given connection. This may be done by taking the weight normally assigned to a single short (e.g., 0.4), and in the case of no shorts, adding this weight to the weight for the Open property. If one or more possible shorts exist, then the weight for shorts may be distributed among the possible shorts by dividing the weight for a connection's Short property by s, where s is the number of possible shorts. This concept is illustrated in FIG. 6.

Board Test Coverage

Figure 7:
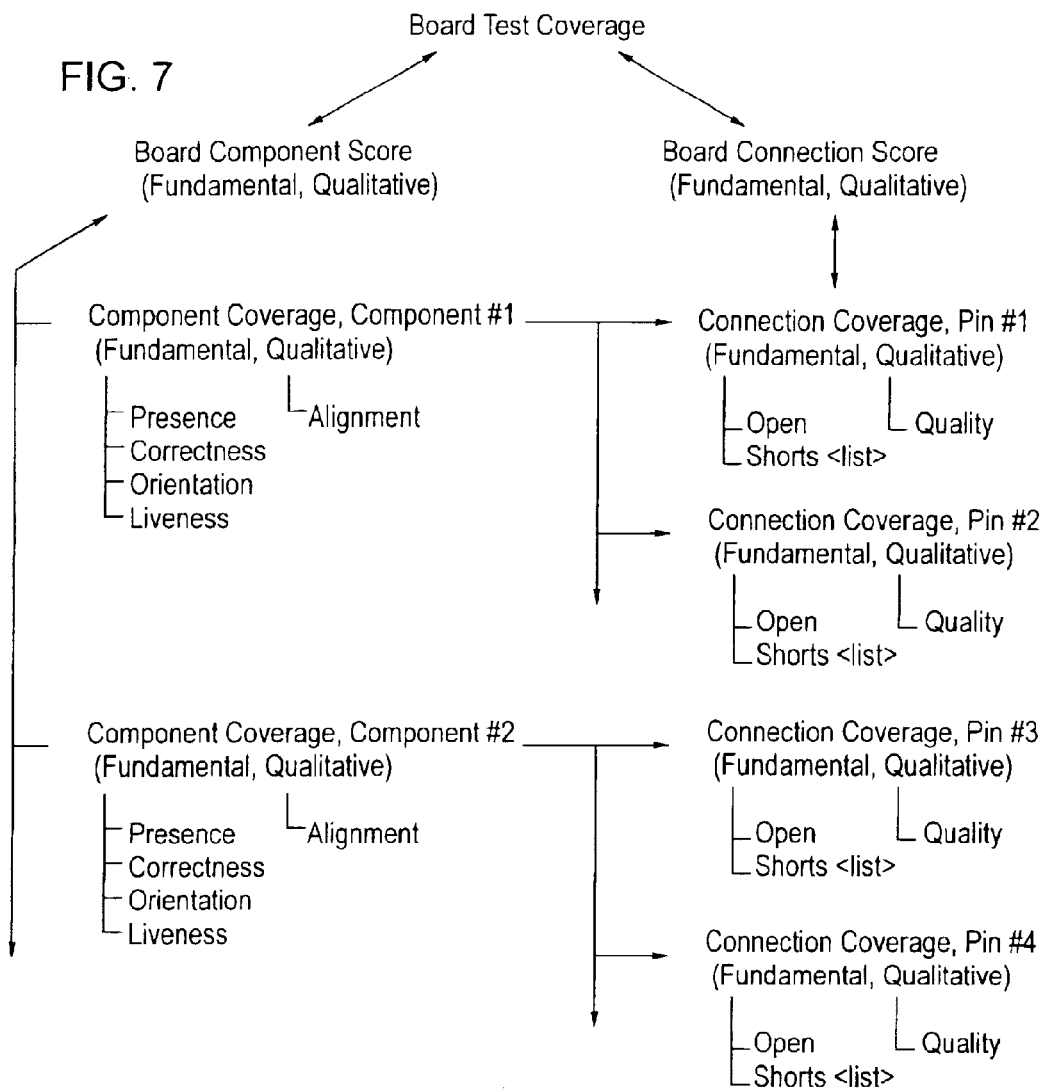
FIG. 7 illustrates an exemplary manner of displaying board test coverage to a user.

FIG. 7 illustrates the manner in which board test coverage results might be reported to a user. Note, however, that FIG. 7 is more of a conceptual illustration, and is not necessarily intended to depict a particular "screen image" that might be presented to user.

FIG. 7 illustrates "board test coverage" as being the root of a tree. In one embodiment of the invention, there is no single indication or "score" that is indicative of board test coverage. Rather, board test coverage is represented by the combination of a board component score and a board connection score (i.e., indicators of board component coverage and board connection coverage). The board component score is indicative of a test suite's ability to test all of the potentially defective properties of all of the components on a board. Likewise, the board connection score is indicative of a test suite's ability to test all of the potentially defective properties of all of the connections on a board.

If a user desires to review board component coverage in further detail, a user may drill down to scores (coverage indicators) for various individual components. Alternatively (not shown), a user might drill down from board component coverage to a "component type", and then drill down to individual components.

For each component, a user may drill down to the individual properties of the component. If desirable, the properties could be grouped as "fundamental" and "qualitative", as previously described.

Similar to the way that users may review component coverage in further detail, users may drill down to scores (coverage indicators) for various individual connections and/or connection groups (not shown). For each connection, a user may drill down to the individual properties of the connection. If desired, the properties could be grouped as "fundamental" and "qualitative".

FIG. 7 further illustrates the correspondence between components and connections. As a result of this correspondence, a user might be offered the option of drilling down into component coverage, and then crossing over to view the connection coverage for a particular component (or maybe component type).

Comparing Board Test Coverage (in General)

Figure 8:
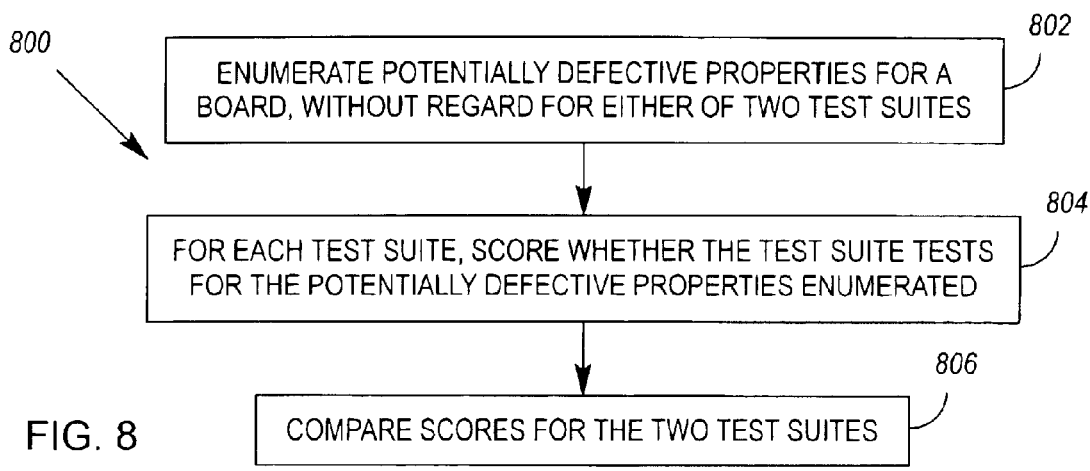
FIG. 8 illustrates a method for comparing board test coverage for two test suites.

The above sections have introduced the concept of comparing test coverage scores for two test suites that are designed to test the same board. FIG. 8 illustrates this concept more generally, as a method 800 for comparing board test coverage for two test suites. The method 800 begins with the enumeration 802 of potentially defective properties for a board, without regard for either of the test suites. For each test suite, the suite is scored 804 in response to whether the suite tests for the potentially defective properties enumerated. Corresponding scores for the two test suites may then be compared 806 to determine the relative coverage that each suite provides for the board.

Theoretical Maximum Scores

There are at least two types of theoretical "maximum scores" that are useful in characterizing board test coverage. These are 1) the maximum scores (component & connection) that can be achieved assuming that all potentially defective properties are Fully Tested, and 2) the maximum scores that can be achieved by a particular test system (or systems) if a test suite is robust.

The maximum scores that can be achieved assuming that all potentially defective properties are Fully Tested is simply:

| | |
|---|---|
| $\text{Max}_1(\text{BDS})$ = for all d, Sum RDS(d); | (where BDS = board component score; and where all component properties influencing RDS(d) are Fully Tested) |
| $\text{Max}_1(\text{BCS})$ = for all c, Sum RCS(c); | (where BCS = board connection score; and where all connection properties influencing RCS(c) are Fully Tested) |

The above "maximum scores" are useful in determining whether there are potentially defective properties that are beyond the scope of a test suite's coverage. However, the above maximums do not indicate whether a defect is beyond the scope of a test suite's coverage because 1) the test suite is not robust, or 2) testing for the defect is beyond the capability of available test systems. It is therefore useful to calculate the maximum scores that can be achieved by a particular test system (or systems) if a test suite is robust. This second pair of maximum scores does not assume that all property scores influencing RDS(d) and RCS(c) are Fully Tested, but rather assumes that each property score achieves the maximum value that is possible given a particular test system (or systems). Thus,

| | |
|---|---|
| $\text{Max}_2(\text{BDS})$ = for all d, Sum RDS(d); | (where all component properties influencing RDS(d) are set to their maximum value given a particular test system (or systems)) |
| $\text{Max}_2(\text{BCS})$ = for all c, Sum RCS(c); | (where all connection properties influencing RCS(c) are set to their maximum value given a particular test system (or systems)) |

FIG. 9 illustrates maximum theoretical component PCOLA scores versus test technology for an arbitrary resistor, and FIG. 10 illustrates maximum theoretical component PCOLA scores versus test technology for an arbitrary digital device. The tables in FIGS. 9 & 10 are simply filled by rating a property "Full" or "Partial" if there is any way a given test system can ever score full or partial coverage for the particular component type at issue (e.g., resistors in FIG. 9, and digital devices in FIG. 10). In filling out the tables in FIGS. 9 & 10, considerations such as the testability of a low-valued capacitor in parallel with a large-valued capacitor, or whether a given IC has a readable label that is covered up by a heat sink, would typically not be considered (since the focus is on "theoretical" maximums).

If $\text{Max}_2(\text{BDS})$ and $\text{Max}_2(\text{BCS})$ scores are being calculated with respect to an AXI test system, then the AXI PCOLA scores can be extracted from FIGS. 9 & 10. However, if $\text{Max}_2(\text{BDS})$ and $\text{Max}_2(\text{BCS})$ scores are being calculated with respect to a combination of AXI and AOI and test systems, then corresponding PCOLA scores for the AOI and AXI lines in FIGS. 9 & 10 can be combined using a MAX( ) function, and the MAX( ) PCOLA scores can then be used in calculating the $\text{Max}_2(\text{BDS})$ and $\text{Max}_2(\text{BCS})$ scores. In this latter case, note for example that the maximum Correctness score for a combination of AOI and AXI testing is "Full".

Apparatus for Characterizing Board Test Coverage

FIG. 11 illustrates a first embodiment of apparatus 1100 for characterizing board test coverage. The apparatus comprises 1) means 1102 for enumerating potentially defective properties for a board, without regard for how the potentially defective properties might be tested, 2) means 1104 for determining and scoring, in relation to each potentially defective property enumerated, whether a test suite tests for the potentially defective property, and 3) means 1106 for combining scores to characterize board test coverage for the test suite. By way of example, the apparatus 1100 could take the form of software, firmware, hardware, or some combination thereof. In one embodiment of the apparatus 1100, each of its components is embodied in computer readable program code stored on computer readable storage media such as: a CD-ROM, a DVD, a floppy disk, a hard drive, or a memory chip.

Figure 12:
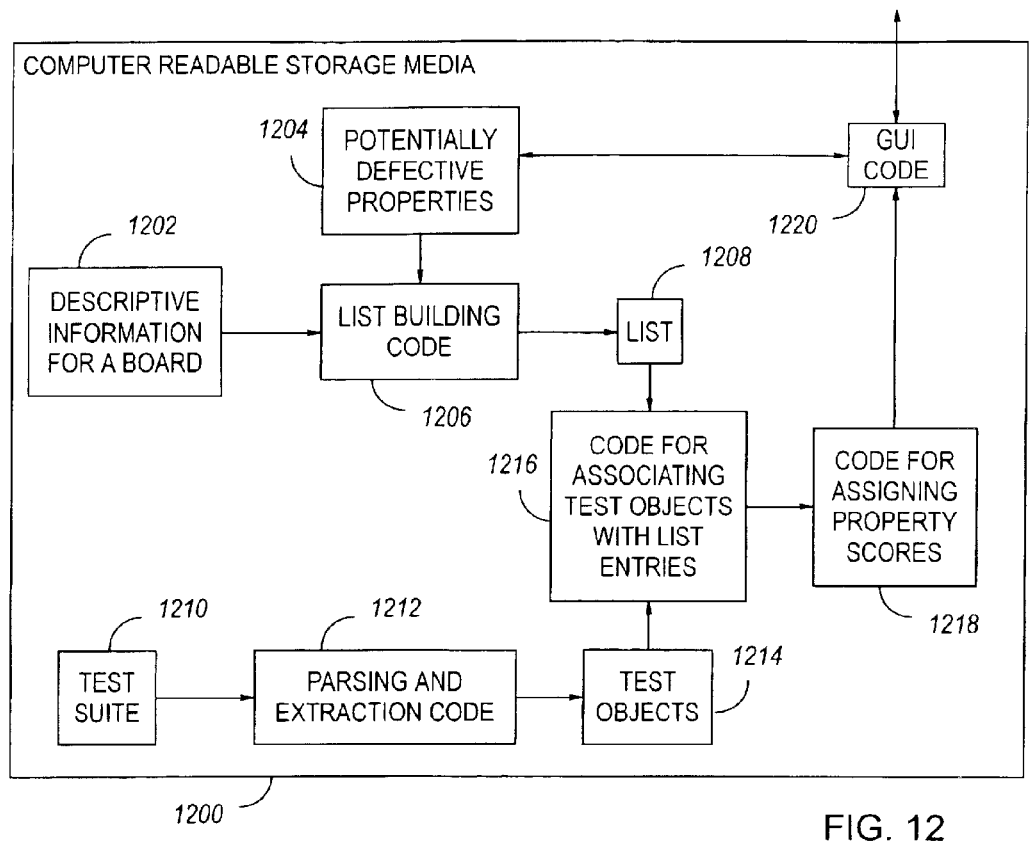

FIG. 12 illustrates a second embodiment of apparatus for characterizing board test coverage. The apparatus is embodied in computer readable program code 1206, 1212, 1216, 1218 stored on computer readable storage media 1200. A first portion of the program code 1206 builds a list 1208 of potentially defective properties for a board. The code does this by parsing descriptive information 1202 for the board to extract component and connection information for the board, and then associating potentially defective properties 1204 with the extracted component and connection information. A second portion of the program code 1212 parses a test suite 1210 and extracts test objects 1214 therefrom. Each test object 1214 comprises the details of a test, and a list of components and connections that are tested by the test. A third portion of the program code 1216 associates the test objects 1214 with entries in the list 1208 of potentially defective properties, by identifying common components and connections in each. A fourth portion of the program code 1218 assigns property scores to the potentially defective properties in said list 1208 of potentially defective properties, in response to whether tests in the associated test objects 1214 test for the potentially defective properties.

The portions of program code need not be distinct. Thus, code, objects, routines and the like may be shared by the various code portions, and the code portions may be more or less integrated depending on the manner in which the code is implemented.

The descriptive board information that is accessed by the code may take the form of an XML topology file for the board. However, the descriptive information could take other forms, and could be derived from a board netlist, a bill of materials, CAD data, or other sources.

Component and connection information may take a variety of forms. For example, component information could take the form of component names or component part numbers. Connections might take the form of pin and node information.

The potentially defective properties that the code associates with a board's component and connection information may be drawn, for example, from a database storing component, package, and/or connection types, along with their potentially defective properties. Information from this database can then be associated with the components and connections that are identified for a particular board. In one embodiment of the FIG. 12 apparatus, the database may be updated via an interface (such as a graphical user interface (GUI) displayed on a computer screen).

Properties that are associated with a board's components and connections may comprise some or all of the PCOLA and SOQ properties identified supra. Furthermore, different potentially defective properties may be associated with different component and connection types. With respect to a connection's possible shorts, program code may associate the short property of a connection with zero or more shorts by assessing the proximity of the connection to other pins and/or nodes identified in the board's descriptive information.

In one embodiment of the FIG. 12 apparatus, the test objects are created as XML objects. However, as one of ordinary skill in the art will recognize, the test objects may be variously maintained. "Object", as used herein, encompasses not only objects in an "object-oriented" programming sense, but also any data structure that is maintained for the purpose of tracking the details of a test, as well as a list of the components and connections that are tested by the test.

Figure 13:
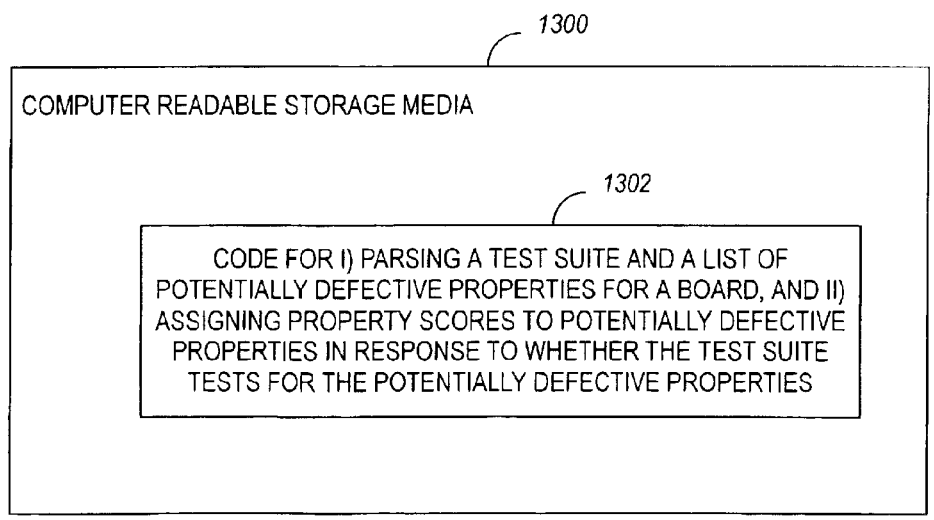

FIG. 13 illustrates a third embodiment of apparatus for characterizing board test coverage. Again, the apparatus is embodied in computer readable program code 1302 stored on computer readable storage media 1300. Unlike the apparatus illustrated in FIG. 12, the apparatus illustrated in FIG. 13 does not participate in building a list of a board's potentially defective properties. Rather, program code 1302 parses an existing test suite and list of potentially defective properties for a board, and then assigns property scores to potentially defective properties in response to whether the test suite tests for the potentially defective properties, and in accordance with a weighting structure.

In one embodiment of the FIG. 13 apparatus, property scores comprise numerical equivalents for: Fully Tested, Partially Tested, and Untested.

When a potentially defective property is tested by two or more tests in a test suite, and two or more property scores exist for the same potentially defective property, additional program code can combine two or more property scores using a MAX function. The program code can also combine a given component's property scores to generate a component score for the given component. Likewise, the program code can combine a given connection's property scores to generate a connection score for the given connection. The program code may also combine all component property scores to generate a board component score, and combine all connection property scores to generate a board connection score.

In one embodiment of the FIG. 13 apparatus, the computer readable program code further comprises program code for i) accessing component property weights for a component's properties, and ii) combining a given component's property scores in accordance with the component property weights for the component's properties.

In another embodiment of the FIG. 13 apparatus, the computer readable program code comprises program code for i) accessing component type weights for component types, and ii) combining property scores corresponding to different component types, in accordance with the component type weights.

The FIG. 13 apparatus may also comprise program code for assigning component type weights by normalizing a Pareto diagram for component type failure onto a unit weight of 1.0. Alternately (or additionally), the apparatus may comprise program code for assigning the component type weights using a uniform distribution.

The program code of the FIG. 13 apparatus may also combine property scores in accordance with a weighting structure by i) calculating a component weight adjuster that is indicative of the population of component types on a given board, and ii) combining property scores in accordance with the component weight adjuster. The program code may also i) access connection property weights for a connection's properties, and ii) combining a given connection's property scores in accordance with the connection property weights for the connection's properties.

Note that apparatus for characterizing board test coverage does not require run-time test data.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for characterizing board test coverage, comprising:
   a) enumerating potentially defective properties for a board, without regard for how the potentially defective properties might be tested;
   b) for each potentially defective property enumerated, generating a property score that is indicative of whether a test suite tests for the potentially defective property; and
   c) combining property scores in accordance with a weighting structure to characterize board test coverage for the test suite.

2. The method of claim 1, wherein combining property scores to characterize board test coverage comprises:
   for a given device, combining the component's property scores to generate a component score.

3. The method of claim 2, wherein combining property scores in accordance with a weighting structure comprises:
   a) assigning component property weights to a component's properties; and
   b) combining component properties in accordance with the component property weights.

4. The method of claim 3, wherein component properties are assigned different component property weights for different component types.

5. The method of claim 3, wherein component properties are assigned different component property weights for different individual components.

6. The method of claim 3, wherein the component property weights for a given component sum to 1.0.

7. The method of claim 1, wherein combining property scores in accordance with a weighting structure comprises:
   a) assigning component type weights to component types; and
   b) combining property scores in accordance with the component type weights.

8. The method of claim 7, wherein component type weights are assigned by normalizing a board's component type failure Pareto diagram onto a unit weight of 1.0.

9. The method of claim 7, wherein component type weights are assigned using a uniform distribution.

10. The method of claim 7, wherein combining property scores in accordance with a weighting structure further comprises:
    a) calculating a component weight adjuster that is indicative of the population of component types on a given board; and
    b) combining property scores in accordance with the component weight adjuster.

11. The method of claim 1, wherein combining property scores in accordance with a weighting structure comprises:
    a) assigning package type weights to package types; and
    b) combining property scores in accordance with the package type weights.

12. The method of claim 1, wherein combining property scores to characterize board test coverage comprises:
    for a given connection, combining the connection's property scores to generate a connection score.

13. The method of claim 12, wherein combining property scores in accordance with a weighting structure comprises:

a) assigning connection property weights to a connection's properties; and
   b) combining property scores for a given connection in accordance with the connection property weights.

14. The method of claim 13, wherein the connection property weights for a given connection sum to 1.0.

15. The method of claim 13, wherein a connection property weight assigned to a connection's short property is distributed amongst the number of possible shorts for the connection.

16. Apparatus for evaluating board test coverage, comprising:
    a) computer readable storage media; and
    b) computer readable program code, stored on the computer readable storage media, comprising program code for i) parsing a test process and a list of potentially defective properties for a board, and ii) assigning property scores to potentially defective properties in response to whether the test process tests for the potentially defective properties, and in accordance with a weighting structure.

17. The apparatus of claim 16, wherein the computer readable program code further comprises program code for combining a given component's property scores to generate a component score for the given component.

18. The apparatus of claim 17, wherein the computer readable program code further comprises program code for i) accessing component property weights for a component's properties, and ii) combining a given component's property scores in accordance with the component property weights for the component's properties.

19. The apparatus of claim 18, wherein component properties have different component property weights for different component types.

20. The apparatus of claim 18, wherein component properties have different component property weights for different individual components.

21. The apparatus of claim 18, wherein the connection property weights for a given component sum to 1.0.

22. The apparatus of claim 16, wherein the computer readable program code further comprises program code for i) accessing component type weights for component types, and ii) combining property scores corresponding to different component types, in accordance with the component type weights.

23. The apparatus of claim 22, wherein the computer readable program code further comprises program code for assigning the component type weights by normalizing a Pareto diagram for component type failure onto a unit weight of 1.0.

24. The apparatus of claim 22, wherein the computer readable program code further comprises program code for assigning the component type weights using a uniform distribution.

25. The apparatus of claim 22, wherein the computer readable program code further comprises program code for combining property scores in accordance with a weighting structure by i) calculating a component weight adjuster that is indicative of the population of component types on a given board, and ii) combining property scores in accordance with the component weight adjuster.

26. The apparatus of claim 16, wherein the computer readable program code further comprises program code for i) accessing package type weights for package types, and ii) combining property scores corresponding to different package types, in accordance with the package type weights.

27. The apparatus of claim 16, wherein the computer readable program code further comprises program code for combining a given connection's property scores to generate a connection score for the given connection.

28. The apparatus of claim 27, wherein the computer readable program code further comprises program code for i) accessing connection property weights for a connection's properties, and ii) combining a given connection's property scores in accordance with the connection property weights for the connection's properties.

29. The apparatus of claim 28, wherein the weighted property scores for a given connection sum to 1.0.

30. The apparatus of claim 28, wherein the property weight assigned to a connection's short property is distributed amongst the number of possible shorts for the connection.

* * * * *